US005485085A

United States Patent [19]
Sumanaweera et al.

[11] Patent Number: 5,485,085
[45] Date of Patent: Jan. 16, 1996

[54] METHOD FOR CORRECTING MAGNETIC FIELD INHOMOGENEITY DISTORTION IN MRI IMAGES HAVING DISCONNECTED REGIONS

[75] Inventors: Thilaka Sumanaweera, Palo Alto; Napel Sandy A.; Gary H. Glover, both of Menlo Park; John R. Adler, Jr., Stanford, all of Calif.

[73] Assignee: Board of Trustees of the Leland Stanford Junior University

[21] Appl. No.: 345,518

[22] Filed: Nov. 28, 1994

[51] Int. Cl.⁶ ..................................................... G01V 3/14
[52] U.S. Cl. ........................................... 324/307; 324/309
[58] Field of Search .................................... 324/307, 309, 324/318

[56] References Cited

U.S. PATENT DOCUMENTS 5,005,578  4/1991  Greer et al. ........................ 324/318 X
5,351,006  9/1994  Sumanaweera et al. ................ 324/309

OTHER PUBLICATIONS

Sumanaweera, et al., Characterization of Spatial Distortion in Magnetic Resonance Imaging and its Implications for Stereotactic Surgery, Neurosurgery, vol. 35, No. 4, Oct. 1994, p. 696.

Suamanaweera, et al., MR Susceptibility Misregistration Correction, IEEE Trans. on Medical Imaging, vol. 12, No. 2, Jun. 1993, p. 251.

*Primary Examiner*—Sandra L. O'Shea
*Assistant Examiner*—Mack Haynes
*Attorney, Agent, or Firm*—Townsend and Townsend and Crew

[57] ABSTRACT

Disclosed is a method to correct the geometric distortion caused by field inhomogeneity in MR images such as images of patients wearing MR-compatible stereotaxic frames. A previous distortion correction method derives patient-dependent error maps by computing the phase-difference of 3D images acquired at different $T_E$'s. The time difference ($\Delta T_E$= 4.9 ms at 1.5 T) is chosen such that the water and fat signals are in phase. However, $\Delta T_E$ is long enough to permit phase wraps in the difference images for frequency offsets greater than 205 Hz. Phase unwrapping techniques resolve these only for connected structures; therefore the phase difference for fiducial rods may be off by multiples of $2\pi$ relative to the head. This uncertainty is removed by using an additional single 2D phase-difference image with $\Delta T_E=1$ ms (during which time no phase-wraps are typically expected) to determine the correct multiple of $2\pi$ for each rod. The method was tested in a cadaver and in a patient using CT as a reference. Targets in the frame coordinates were chosen from CT and compared to their locations in MR. Localizing errors were as large as 3.7 mm before correction and were reduced to less than 1.11 mm after correction.

6 Claims, 9 Drawing Sheets

METHOD FOR CORRECTING MAGNETIC FIELD INHOMOGENEITY DISTORTION IN MRI IMAGES HAVING DISCONNECTED REGIONS

BACKGROUND OF THE INVENTION

This invention relates generally to magnetic resonance imaging (MRI), and more particularly the invention relates to the correction of spatial distortion in magnetic resonance images due to magnetic field inhomogeneities in disconnected regions being imaged.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

The term "stereotaxis" refers to a collection of neurosurgical techniques that apply simple geometric relationships to radiological studies thereby facilitating the treatment of certain disorders of the brain with great accuracy. Over the past decade computed tomography (CT) has been the primary mode of target localization in stereotaxic surgery. However, with the advent of the high resolution, high SNR, fast MR scanners, MR is more frequently applied to stereotaxic surgery because of its superior soft-tissue contrast.

In magnetic resonance imaging (MRI)-based stereotaxic surgery, a coordinate frame (an MR fiducial system) consisting of a set of MR-imageable fiducial rods is rigidly affixed to the head. The rods are made of a material that produces high signal intensity in MR images. The head and the MR fiducial system are then imaged, the locations of the fiducial rods are estimated from the images, and targets within the head are referenced to the MR fiducial system. In practice, however, the fiducial rods and the head cause local distortions in the main magnetic field. This, in turn, causes spatial distortion in the images, thus leading to poor target localization accuracy.

U.S. Pat. No. 5,351,006 is directed to an improved method and apparatus for correcting spatial distortion in magnetic resonance images due to magnetic field inhomogeneities in an object being imaged.

The method is practiced in vivo by establishing a map of the magnetic field, $B_o$, at various points in an object to be imaged, thereby defining the geometric distortion due to magnetic field inhomogeneities at the various points. The $B_o$ map is obtained by applying different magnetic pulse sequences from which a measure of magnetic field inhomogeneities can be obtained. For example, gradient recalled echo (GRE) sequences or spin echo sequences can be applied so that the phase difference in two acquisitions gives a measure of the magnetic field inhomogeneity at each point.

The present invention is directed to distortion correction that specifically addresses the case where several disconnected regions are present in the imaged volume. This case includes stereotaxic frames mounted on heads.

SUMMARY OF THE INVENTION

In accordance with the invention, a method of correcting for phase-wraps in detected phase accrual between disconnected regions is provided for magnetic resonance images having spatial distortion due to magnetic field inhomogeneity. In a specific embodiment in which a stereotaxic frame is employed about a patient's head for spatial reference purposes, the disconnected regions are the individual rods of the frame and the patient's head.

In practicing the method, a first map of off-resonant nuclei spins, $\Delta\phi_1$, is obtained during a first known time interval, $\Delta T_{E2}$, as a measure of perturbations, $\Delta B_o$, in a magnetic field, $B_o$, with $\Delta T_{E2}$ chosen so that a phase-difference between fat and water signals is a non-zero integer multiple of $2\pi$ and phase-wraps between regions are present in the map of $\Delta\phi_1$.

A second map of off-resonant nuclei spins, $\Delta\phi_s$, encompassing all disconnected regions in the volume is obtained during a second known time interval, $\Delta T_{E1}$, as a measure of perturbations, $\Delta B_o$, in the magnetic field, $B_o$, with $\Delta T_{E1}$ being shorter than $\Delta T_{E2}$ and chosen to eliminate phase-wraps in the second map.

A ratio of $\Delta T_{E2}/\Delta T_{E1}$ of the phase accrual at points in the second map is then subtracted from the phase accrual at the corresponding points in the first map, with the differences divided by $2\pi$ and rounded off to the nearest integer to obtain the numbers of phase-wraps at the points and for individual connected regions such as each rod and the brain. The integer multiples of $2\pi$ phase-wraps are then subtracted from the accrued off-resonant spin values in the first map to obtain $\Delta\phi_1$, a map corresponding to true $B_o$ variations.

In a preferred embodiment, the first map is three dimensional and the second map is two dimensional and corresponds to an axial slice through the three dimensional map.

The invention and objects and features thereof will be more readily apparent from the following detailed description and appended claims when taken with the drawing.

BRIEF DESCRIPTION OF THE DRAWINGS

FIGS. 9A[1]–9B[2] illustrate disparities in the segments of FIG. 8 for fully corrected, partially corrected, and uncorrected MR data sets.

DETAILED DESCRIPTION OF THE ILLUSTRATIVE EMBODIMENTS

Figure 1A:
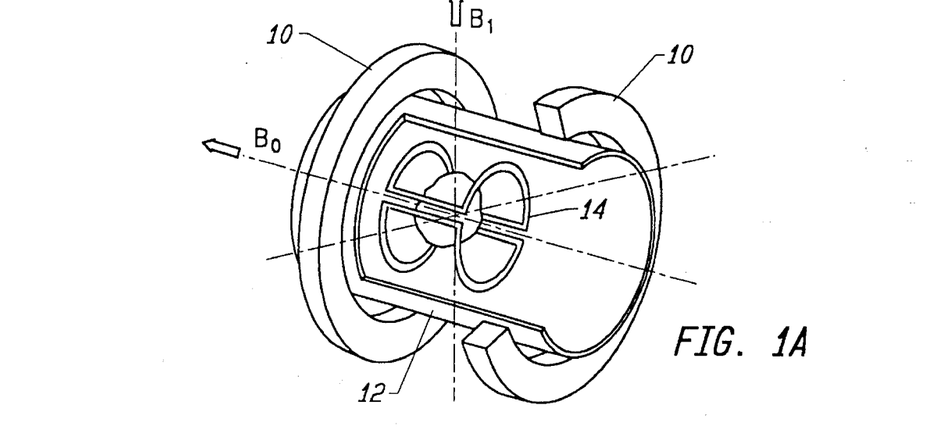
FIG. 1A–1D illustrate the arrangement of conventional MRI apparatus and magnetic fields generated therein.
Figure 1B:
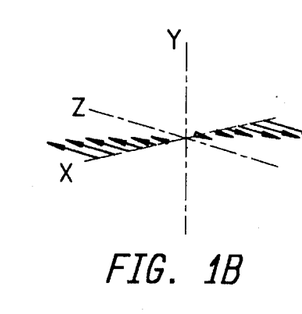
Figure 1C:
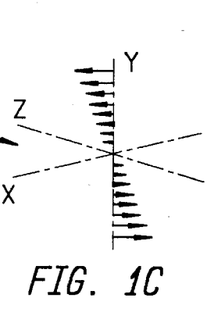
Figure 1D:
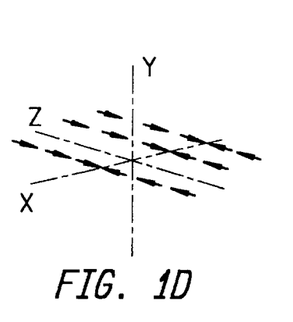

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE,* Vol. 71, No. 3, March 1983, pp. 338–350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y and Z axes. FIGS. 1C and 1D are similar representations of the Y gradient and Z gradient fields, respectively.

Figure 2:
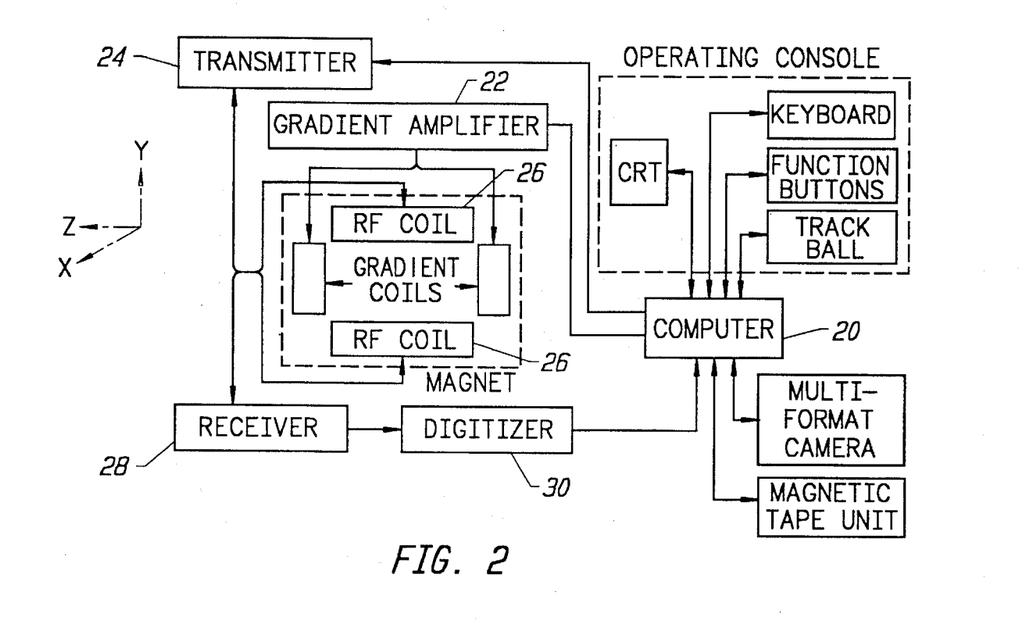
FIG. 2 is a functional block diagram of MRI imaging apparatus.

FIG. 2 is a functional block diagram of the imaging apparatus. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

The most complex source of geometric distortion in MR images is magnetic field inhomogeneities caused by the imaged object. During MR imaging, a uniform magnetic field, $B_o$, is desired throughout the imaging volume. However, in practice the $B_o$ field is perturbed by the imaged object. These perturbations depend on the magnetic susceptibility of the material being imaged as well as the shape of the object. The local perturbations of the $B_o$ field, $\Delta B_o$, cause proportional misregistration of pixels in the image along the read-out direction. U.S. Pat. No. 5,351,006 discloses a method to correct this distortion by using $\Delta B_o$-maps, which are identical to the pixel position error maps up to a known constant factor.

The perturbations in the $B_o$ field lead to off-resonant spins of protons. These off-resonant spins accrue phase during a known time interval, $\Delta T_E$. The phase accrued during $\Delta T_E$, $\Delta\phi$, is proportional to the $\Delta B_o$-map. A $\Delta\phi$-map can be obtained by acquiring two MR scans with slightly different echo times and calculating the true phase difference between the two images. The difference between the two echo times, $\Delta T_E$, must be chosen such that the phase-difference between the fat and water signals is a non-zero integer multiple of $2\pi$. For example, when $B_o$=1.5 T, $\Delta T_E$≈4.9 ms produces a phase-difference of $2\pi$. However, this means that frequency differences are unambiguously resolved only when they are less than the fat-water chemical shift of about 3.2 ppm (or about 205 Hz at 1.5 T). Frequency offsets beyond this are "aliased" by phase-wrap ambiguities of $2\pi$ multiples, which must be unwrapped before the $\Delta\phi$-map can be used for correcting distortion. Once the true $\Delta\phi$-map (and hence the $\Delta B_o$-map) is obtained, the pixels in the magnitude image can be remapped to their correct locations by using an interpolation method.

Figure 3A:
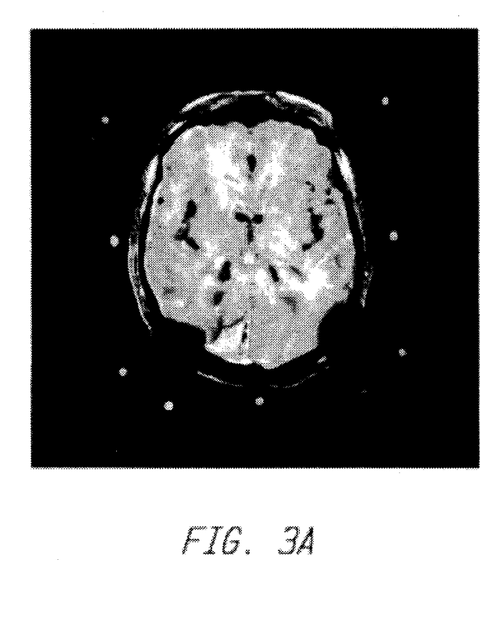
FIG. 3A illustrates a magnitude image of a slice through brain.
Figure 3B:
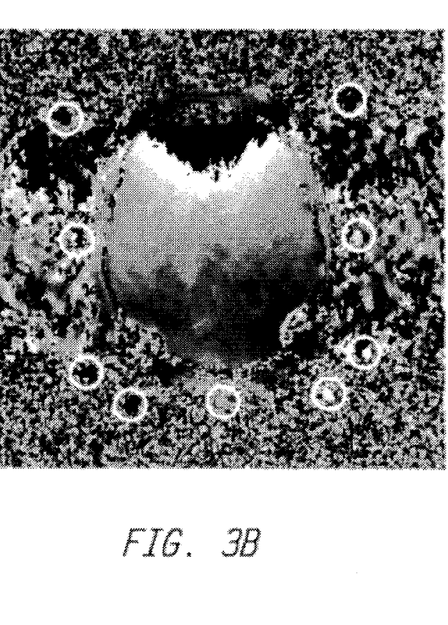
FIG. 3B illustrates a $\Delta\phi$-map before phase-unwrapping.
Figure 3C:
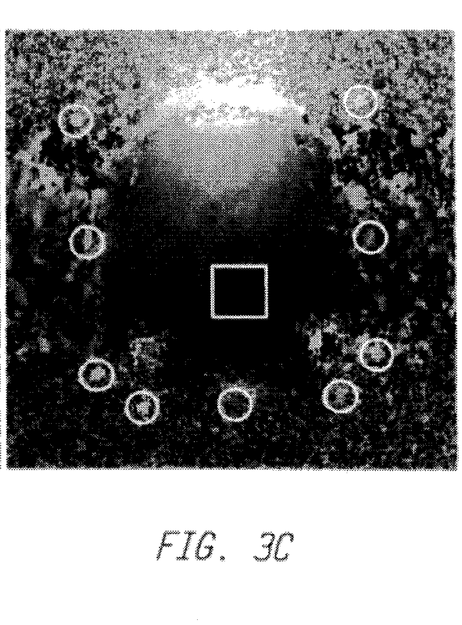
FIG. 3C illustrates the $\Delta\phi$-map after phase-wrapping ($\Delta\phi_1$-map) with white circles highlighting the fiducial rods and the square denoting a region deep inside the brain, within which $\Delta\phi_1$ is fairly constant.

The method described in U.S. Pat. No. 5,351,006 uses a 3D phase-unwrapping technique. This method (as well as most other phase-unwrapping methods) establish $\Delta\phi$ correctly only within connected components in the imaged volume. If we define a "component" as a subvolume within the imaged volume that produces MR signals, a component within a volume is "connected" if any two points in the component can be joined by a curve that is completely contained in the component. FIG. 3 shows an MR image of a head with an MR fiducial system, and its $\Delta\phi$-map before unwrapping and after unwrapping. Notice that in FIG. 3A, there are several connected components: the head and the fiducial rods. Although FIG. 3C shows that the phase-unwrapper has properly unwrapped $\Delta\phi$ inside each connected component, the phase relationships between connected components can not be established. As a result, in the images produced by the method described in the '006 patent, the positions of the fiducials may be misregistered with respect to the head while maintaining spatial accuracy within the head.

In accordance with the invention, an additional rapidly acquired 2D $\Delta\phi$-map is used to establish the phase relationships between the head and the fiducial rods. As mentioned before, we required that the fat and water signals be out of phase by a non-zero integer multiple of $2\pi$ in order for the $\Delta\phi$-map to be accurate for pixels containing both species. Unfortunately, at $B_o$=1.5 T, the shortest $\Delta T_E$ that meets the above criterion (4.9 ms) produces several phase-wraps in the difference images due to field inhomogeneity over the field of view of a typical head. In other words, the field inhomogeneity typically exceeds the fat-water chemical shift (3.2 ppm or about 205 Hz at 1.5 T). However, if we relax the criterion that the fat and water signals must be out of phase by a non-zero integer multiple of $2\pi$, we could still calculate a $\Delta\phi$-map that would be accurate in homogeneous regions where either only water or only fat is present. At $B_o$=1.5 T, setting $\Delta T_E$=1 ms typically does not result in phase-wraps in the $\Delta\phi$-map over the field of view of a typical head. This translates into accommodating a field inhomogeneity of about 15.7 ppm (compared to 3.2 ppm earlier) before aliasing in $\Delta\phi$ takes place, which is well within typical limits. Since phase-wrapping is not required with this $\Delta T_E$, the $\Delta\phi$-map corresponds to the absolute phase-evolutions of the off-resonant spins. Assuming the MR signal-producing materials in the fiducial rods and deep within the brain are each homogeneous, we obtain a $\Delta\phi$-map which is accurate inside the fiducial rods as well as deep within the brain. Although this $\Delta\phi$-map will not be accurate in regions where MR signal-producing fat is present in addition to water (e.g. near eyes and skin), it is not an issue if we only use the data within the homogeneous fiducial rods and deep within the brain.

This shorter-$\Delta T_E$ ($\Delta T_{E1}$) $\Delta\phi$-map ($\Delta\phi_s$-map) inside the tubes can be used to establish the correct number of $2\pi$ multiples of relative differences of $\Delta\phi$ between the head and the fiducial rods in the larger-$\Delta T_E$ ($\Delta T_{E2}$) $\Delta\phi$-map ($\Delta\phi_1$-map) in a manner analogous to that used to increase the SNR of phase contrast velocity measurements. Note that although the $\Delta\phi_1$-map is a 3D volume, all connected components corresponding to the head and the fiducial rods can be intersected by a single 2D axial slice. Therefore, the $\Delta\phi_s$-map needs only be a 2D slice, thus minimizing the additional scanning time required. The procedure is as follows:

1. Generate a 3D magnitude image, I, and a 3D $\Delta\phi_1$-map ($\Delta T_E$=4.9 ms at $B_o$=1.5 T) of the head and the fiducial rods. The $\Delta\phi_1$ map can be phase unwrapped within individual regions by using a known phase unwrapping technique such as disclosed in Song U.S. Pat. No. 5490H-213 for Phase Wrapping of MR Phase Images using Poisson Equation. Select an axial slice through the brain and all the fiducial rods in this volume. Let $I_1$ and $\Delta\Phi_1$ denote the magnitude and the $\Delta\phi_1$-values corresponding to this slice. Acquire a 2D magnitude image, $I_s$, and a 2D $\Delta\Phi_s$-map, $\Delta\Phi_s$ ($\Delta T_E$=1.0 ms at $B_o$=1.5 T), at this slice with the same center frequency as with the 3D acquisition.

2. Suppose there are n fiducial rods. Let κ be the largest noise value in I. Threshold $I_s$ and $I_1$ with respect to κ and extract all the connected components. There will be n elliptical components, $S_i$ (i=1 . . . n), in $I_s$ and n elliptical components, $L_i$ (i=1 . . . n), in $I_1$, corresponding to the fiducial rods (regions inside the circles in FIGS. 1(c) and 3(a)) in addition to the head. Identify the components corresponding to the rods for step 4 below.

3. Deep within the brain, the magnetic field typically varies slowly compared to regions near air/tissue interfaces (FIG. 1(c)). Manually pick small, fairly constant regions, $B_s$ and $B_1$ in $\Delta\Phi_s$ and $\Delta\Phi_1$ corresponding to the same area deep within the brain (squares in FIGS. 1(c) and 3(a)).

4. Let $s_i$ be the average $\Delta\phi_s$ in $S_i$ and $s_b$ in $B_s$. Similarly, let $l_i$ be the average $\Delta\phi_1$ in $L_i$ and $l_b$ in $B_1$.

5. Calculate the integers $\kappa_i$ and $\kappa_b$ (rounding off to whole integers) such that:

$$k_i = \text{ROUND}\left(\frac{1}{2\pi}\left[l_i - s_i \frac{\Delta T_{E2}}{\Delta T_{E1}}\right]\right), i=1\ldots n, \quad [1]$$

$$k_b = \text{ROUND}\left(\frac{1}{2\pi}\left[l_b - s_b \frac{\Delta T_{E2}}{\Delta T_{E1}}\right]\right). \quad [2]$$

6. Now calculate a new set of integers for each fiducial rod:

$$\hat{\kappa}_i = \kappa_i - \kappa_b, i=1\ldots n \quad [3]$$

7. Threshold the volume I with respect to κ. Use $L_i$'s as seeds and extract the cylindrical connected components, $V_i$ (i=1 . . . n), from I corresponding to the fiducial rods. Create a rectified $\Delta\phi_r$-map ($\Delta\phi_L$-map) as follows. Let $\Delta\phi_r$(p) and $\Delta\phi_L$(p) be the $\Delta\phi_r$- and $\Delta\phi_L$-values at image locations p.

$$\Delta\phi_L(p) = \begin{cases} \Delta\phi_1(p) - 2\pi\hat{\kappa}_i & \text{if } p \in V_i \\ \Delta\phi_1(p) & \text{otherwise} \end{cases} \quad [4]$$

This $\Delta\phi_L$-map can be used in place of the $\Delta\phi_r$-map (the map obtained using the 3D data alone) to interpolate the magnitude images and correct geometric distortion as previously described is in the '006 patent.

In step 4, $\Delta\phi$-values are averaged to obtain a better estimate of the values inside each region. This is appropriate since inside the fiducial rods, which are cylinders, the magnetic field can be shown to be constant while deep within the brain the magnetic field is fairly constant as well.

To validate our method, we performed two experiments, one in a cadaver and one in a patient. In both cases, a commercial MR fiducial system (BRW localizer) was mounted on the head. Both CT (GE HiSPEED Advantage) and MR (GE Signa 1.5 T) axial scans were performed. The fiducial rods were visible in MR as bright elliptical areas. In CT they were visible as bright elliptical annular regions corresponding to Plexiglass surrounding somewhat bright elliptical regions corresponding to the fiducial material. For MR, a set of 3D MR images with a 3D $\Delta\phi_r$-map and a single 2D MR image (with the same image resolution as the 3D images) with a 2D $\Delta\phi_s$-map were obtained using the same center frequency. The 2D MR slice corresponded to one of the slices in the 3D MR images and intersected all the fiducial rods and the head. The $\Delta\phi_L$-map was generated as described in the '006 patent and used to correct the geometric distortion in magnitude images. Two types of techniques were used to correct the geometric distortion in MR: correction using the $\Delta\phi_r$-map (partial correction) and correction using the $\Delta\phi_L$-map (full correction) in accordance with the invention.

To ascertain the accuracy of the method, we compared the locations of specified targets in the corrected and uncorrected images in the fiducial system coordinate space (frame-space) using CT as the reference or "gold standard." In order to estimate the transformation parameters (3 rotation and 3 translation parameters) between each image-space and the frame-space, we fit a geometric model of the fiducial system to the image data. The centers of the fiducials were determined by first detecting contours in all the images using the Wang-Binford edge detector and then fitting ellipses to the contours belonging to the fiducial rods. The model of the fiducial system, consisting of the axes of the tubes, was then fit to the centers of the ellipses using the Levenberg-Marquardt nonlinear optimization method to estimate the transformation parameters.

For the cadaver, the in-plane resolution of CT was 0.67 mm with 1.0 mm-thick contiguous slices. For MR, the images were acquired using 3D GRASS sequences ($B_o$=1.5 T, $T_{E1}$=12.0 ms, $T_{E2}$=16.9 ms, $T_R$=33.3 ms and 30° flip angle) with a 1.09 mm×1.09 mm×1.0 mm voxel size.

The targets were a set of Pyrex capillary tubes (3 mm external diameter and 1.5 mm internal diameter) filled with copper sulfate solution. The tubes were inserted into the cadaver head and rigidly anchored at the ends to the skull. The copper sulfate in the tubes showed up in MR as bright spots. In CT, they were bright elliptical annular regions corresponding to the glass, surrounding not-so-bright elliptical regions corresponding to the copper sulfate. A 2D-gaussian fitting technique was used to detect the axis of the tubes in the three types of MR data sets (uncorrected, partially corrected and fully corrected). The contour-detection followed by ellipse-fitting technique described above was used to detect the axes of the tubes in CT.

For the patient, the in-plane resolution of CT was 0.67 mm with 3.0 mm-thick contiguous slices. For MR, we used 3D GRASS sequences ($B_o$=1.5 T, $T_{E1}$=12.0 ms, $T_{E2}$=16.9 ms, $T_R$=33.3 ms and 30° flip angle) with a 1.17 mm×1.17 mm×3.0 mm voxel size.

Figure 4:
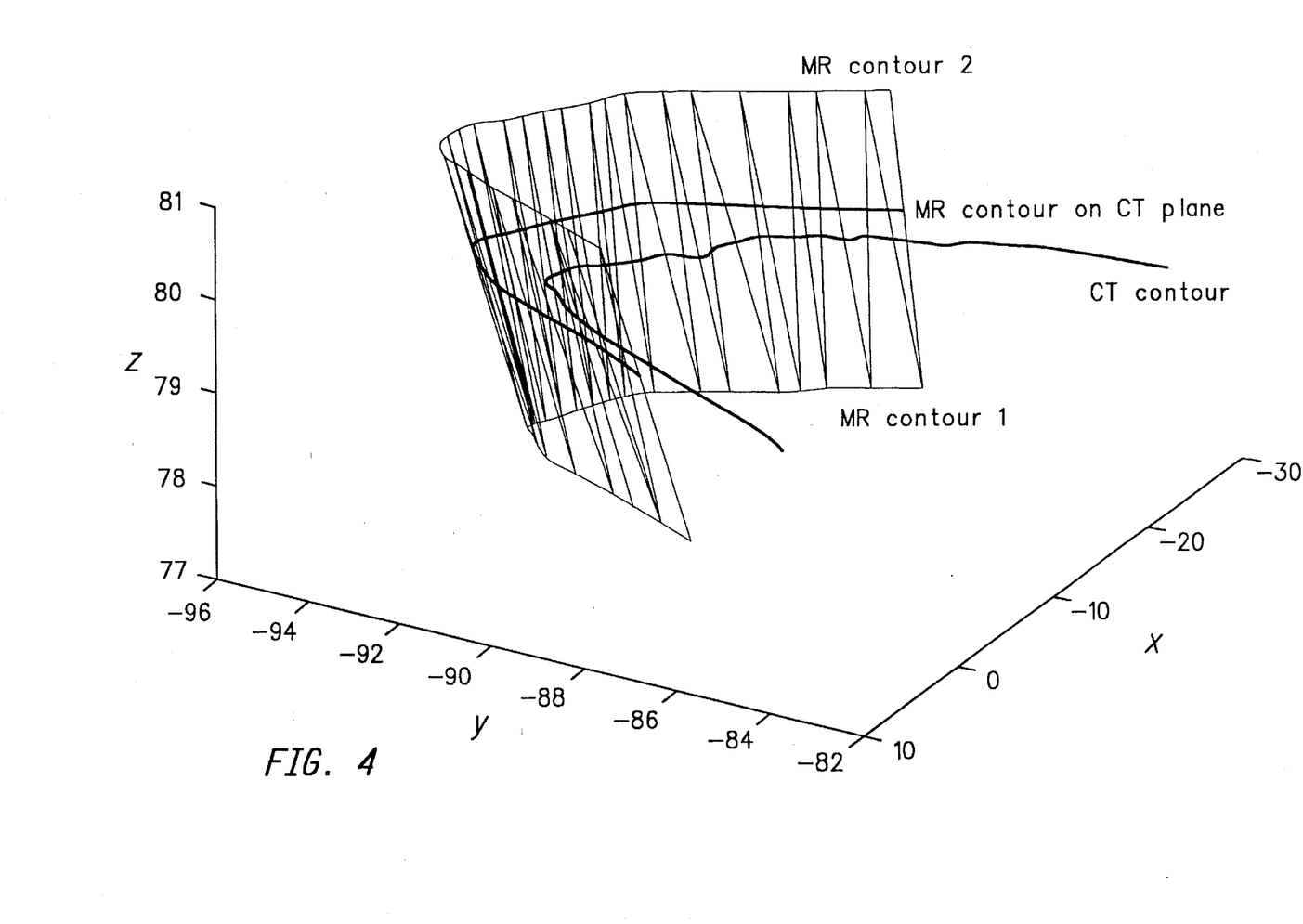
FIG. 4 illustrates contours 1 and 2 in the MR-space tiled to form a surface.

All of the contours in CT and the three types of MR data sets (uncorrected, partially corrected and fully corrected) were detected with the Wang-Binford edge detector. The location of the skull-brain boundary as depicted in the CT images was compared to the location of the same boundary in all those MR data sets. Note that a given axial CT slice will not, in general, map to an acquired MR slice. Therefore, for each of the 3 MR data sets, we extracted a 3D skull-brain surface from the MR data by tiling the contours corresponding to the skull-brain boundary from several contiguous MR slices using the method described by Fuchs et al., Fuchs H, Kadem Z. M., and Uselton S. P. Optimal Surface Reconstruction from Planar Contours. Graphics and Image Processing, October 1977; 20(10):693–702. Communications of ACM. These surfaces were then projected into the frame-space using the transformations derived as described above. The intersection of these surfaces with a single plane corresponding to an acquired CT slice was then compared to the skull-brain contour detected in the CT slice (FIG. 4).

Figure 5A:
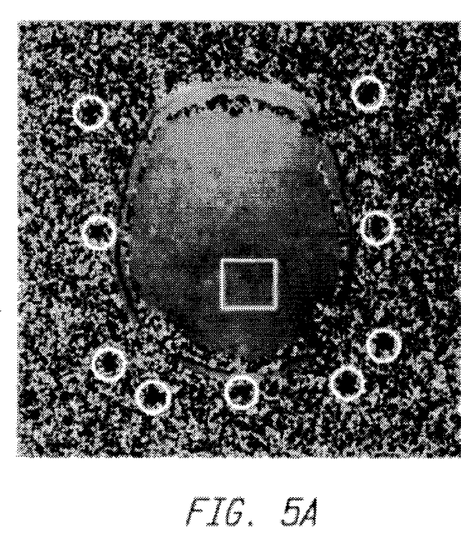
FIG. 5A illustrates a $\Delta\phi_s$-map ($\Delta\phi$-map at $\Delta T_E=1$ ms) with an absence of phase wraps during this short $\Delta T_E$.
Figure 5B:
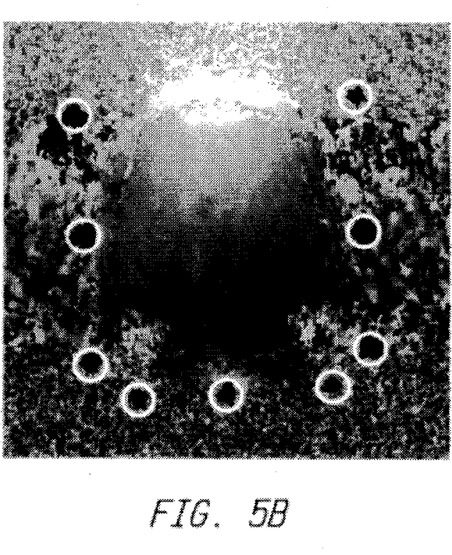
FIG. 5B illustrates a $\Delta\phi_L$-map after adjusting the values inside the fiducials in accordance with the invention.
Figure 5C:
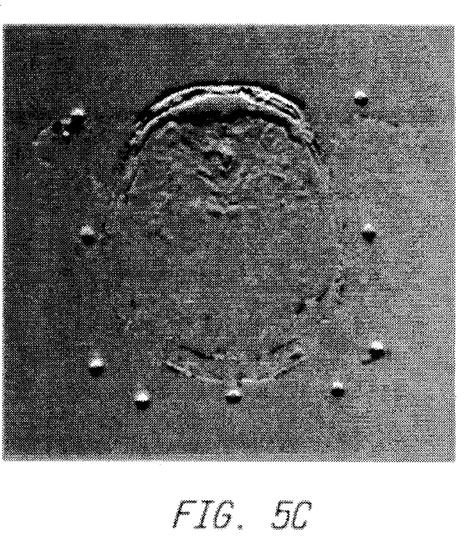
FIG. 5C illustrates the difference of the magnitude images before and after correction.

FIG. 5A shows the 2D $\Delta\phi_s$-map corresponding to $\Delta T_E$=1 ms for the patient study. Compared to FIG. 3C, which shows the corresponding slice of the $\Delta\phi_r$-map (unwrapped) the values inside the fiducial tubes in the $\Delta\phi_s$-map differed by 1 or 2 multiples of $2\pi$ (light gray compared to dark gray). (The transaxial fiducials were typically off by $4\pi$ and the slanted fiducials by $2\pi$.) FIG. 5B shows a slice of the 3D $\Delta\phi_L$-map (rectified $\Delta\phi_r$-map) generated using the 3D $\Delta\phi_r$-map and the 2D $\Delta\phi_s$-map. This $\Delta\phi_L$-map was then used to correct the geometric distortion in the 3D MR images. FIG. 5C is a difference image of the slice shown in FIG. 3A before and after correction. Note that the fiducials and the front of the head have been shifted along the read-out direction (vertical) while areas deep within the brain show little distortion.

Figure 6A:
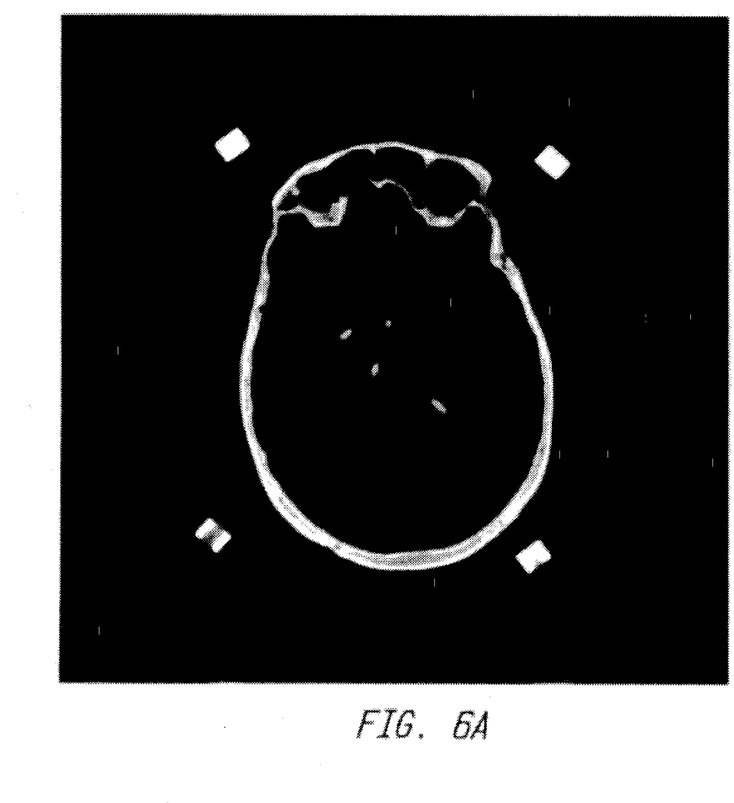
FIG. 6A and FIG. 6B illustrate CT and MR images of a cadaver head with tube-like landmarks inserted, respectively.
Figure 6B:
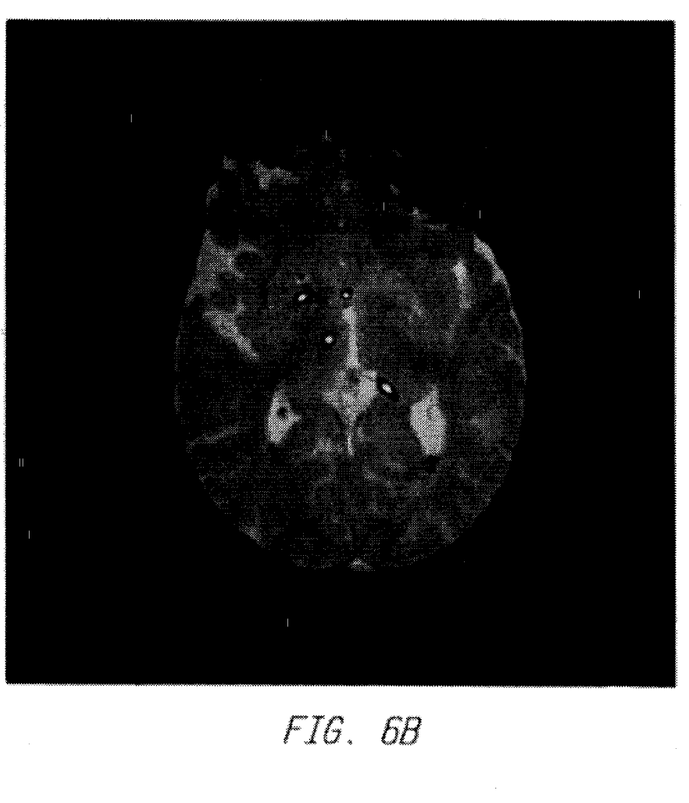
Figure 7A:
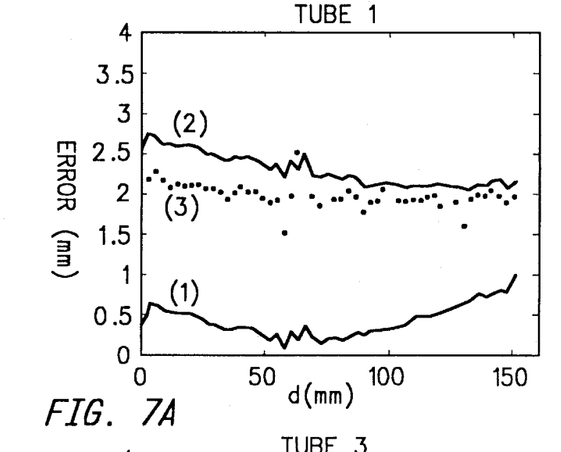
FIG. 7A–7D illustrate plots for four tubes in FIG. 4 using uncorrected, partially corrected, and fully corrected MR points.
Figure 7B:
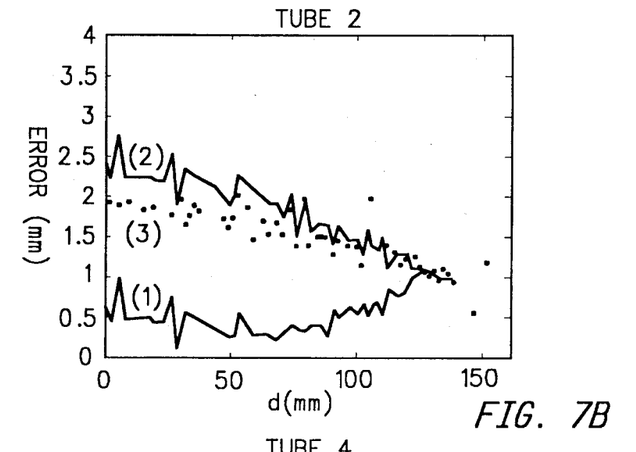
Figure 7C:
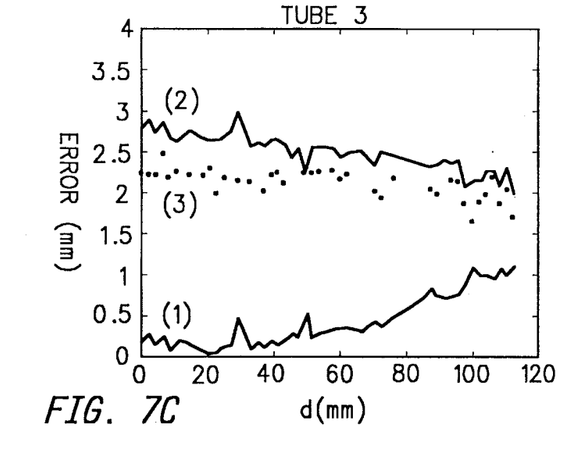
Figure 7D:
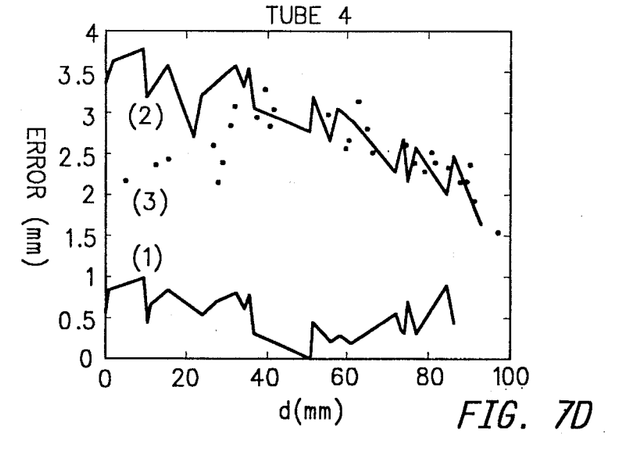

FIG. 6 shows CT and MR images of the cadaver head. Notice that the tubes are visible in both CT and MR images. The tube axes were detected in both CT and MR images and projected into the frame-space. Straight lines were fit to the CT points. For all tubes, the closest distance, y, from each MR point, p, to the corresponding straight line in CT was plotted as a function of the distance, x, from the end of the line to the point on the line closest to p. FIGS. 7A–7D show these plots for the four tubes using uncorrected, partially corrected and fully corrected MR points. Table 1 below shows the mean ($\mu$), standard deviation ($\sigma$) and the range ($\rho$) of the value of y for each tube and for each type of geometric distortion correction. Without any correction, the locations of the targets localized using MR differed from those localized using CT by a worst case error of 3.3 mm. Partial MR correction actually made matters worse; worst case error was 3.76 mm. This may be attributable to the incorrect $2\pi$ multiples of relative differences of $\Delta\phi$ between the fiducial rods and the head. Full correction reduced the worst case error to 1.1 mm.

In our experiments, the stereotaxic frame-based target localization accuracy using MR without any field inhomogeneity distortion correction was on the order of 3.7 mm compared to that of CT. The largest error is due to the magnetic susceptibility-based field inhomogeneity distortion caused by the material inside the stereotaxic fiducial frames. Although our previously published method (Magnetic Resonance in Medicine 1994; 31:40–47) works well inside connected components by correcting local geometric distortion, it fails to correct the global distortion between the separate connected components. Our new method unwraps the relative phase differences between connected components by using an additional 2D $\Delta\phi$-map with a shorter echo time difference. In our experiments, this method improved the worst case MR-based target localization accuracy to about 1.11 mm. Although this method requires an additional 2D $\Delta\phi_s$-map (corresponding to $\Delta T_E = 1$ ms at $B_o = 1.5$ T) intersecting all the fiducial rods and the brain, the time required to acquire this additional map is typically small compared to the total time required for the scanning.

TABLE 1

| | MRI Distortion Correction for Stereotaxy | | | | | |
|---|---|---|---|---|---|---|
| | Tube 1 | | | Tube 2 | | |
| | None | Partial | Full | None | Partial | Full |
| $\mu$ | 1.97 | 2.30 | 0.41 | 1.47 | 1.69 | 0.53 |
| $\sigma$ | 0.16 | 0.21 | 0.20 | 0.35 | 0.49 | 0.24 |
| $\rho$ | (1.51, 2.51) | (2.05, 2.75) | (0.09, 0.96) | (0.52, 2.00) | (0.89, 2.71) | (0.16, 1.06) |
| | Tube 3 | | | Tube 4 | | |
| | 2.14 | 2.51 | 0.44 | 2.55 | 2.90 | 0.53 |
| | 0.17 | 0.23 | 0.35 | 0.40 | 0.55 | 0.25 |
| | (1.67, 2.49) | (2.00, 2.98) | (0.05, 1.10) | (1.51, 3.30) | (1.63, 3.76) | (0.03, 0.99) |

Figure 8:
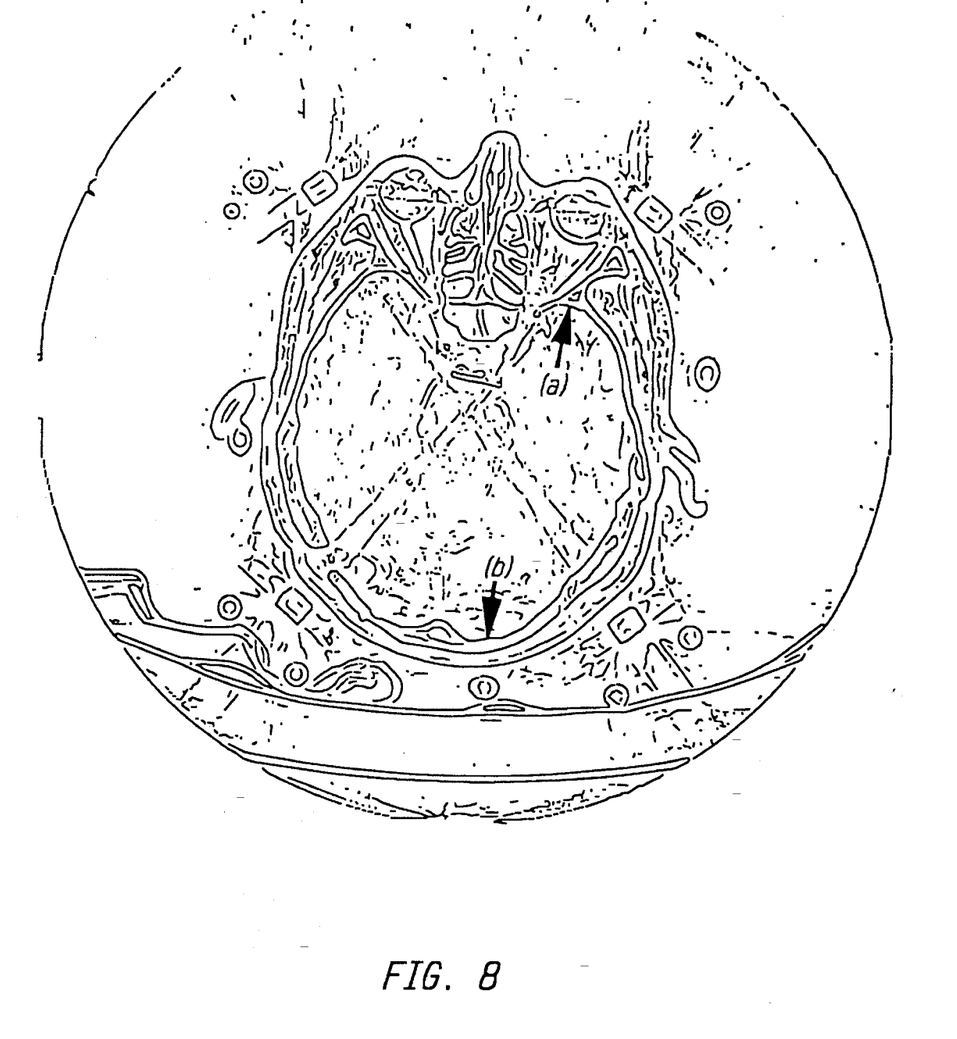
FIG. 8 illustrates a cross-section of a brain and skull with two segments of the boundary marked by arrows.
Figure 9A:
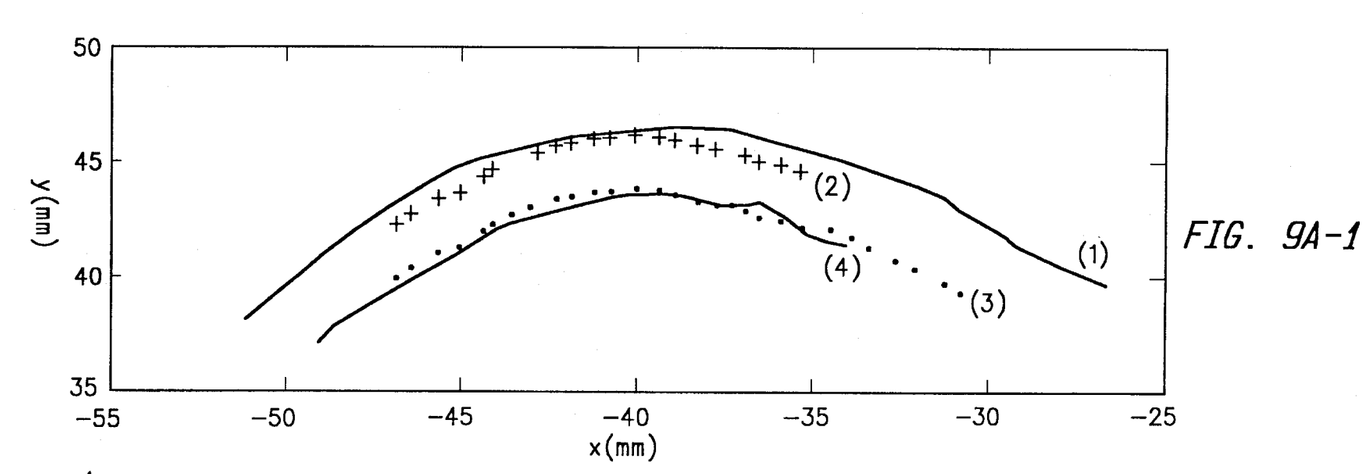
Figure 9A:
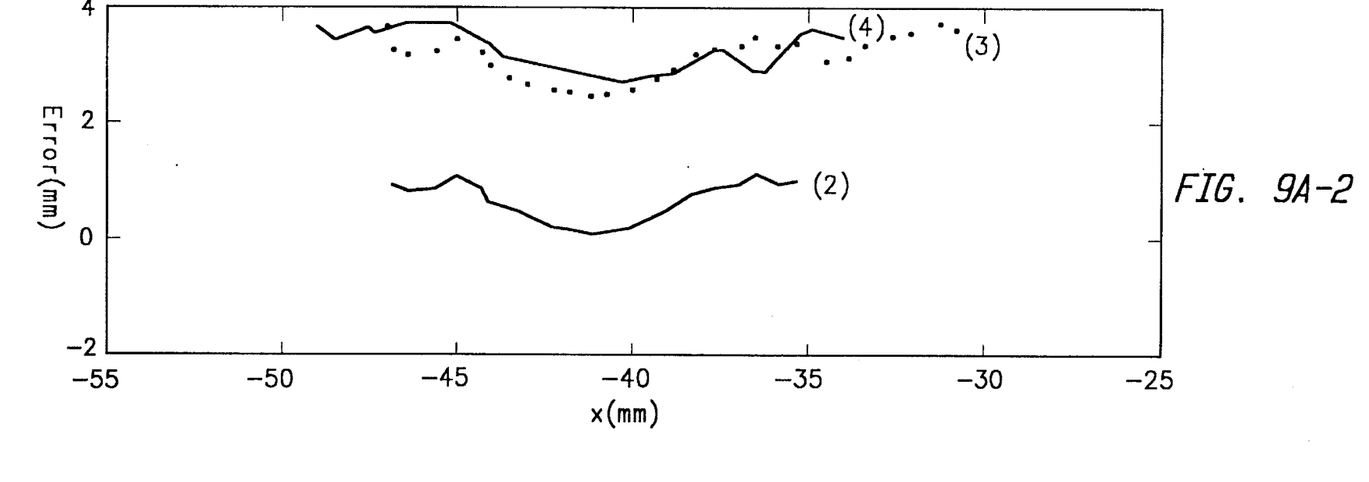
Figure 9B:
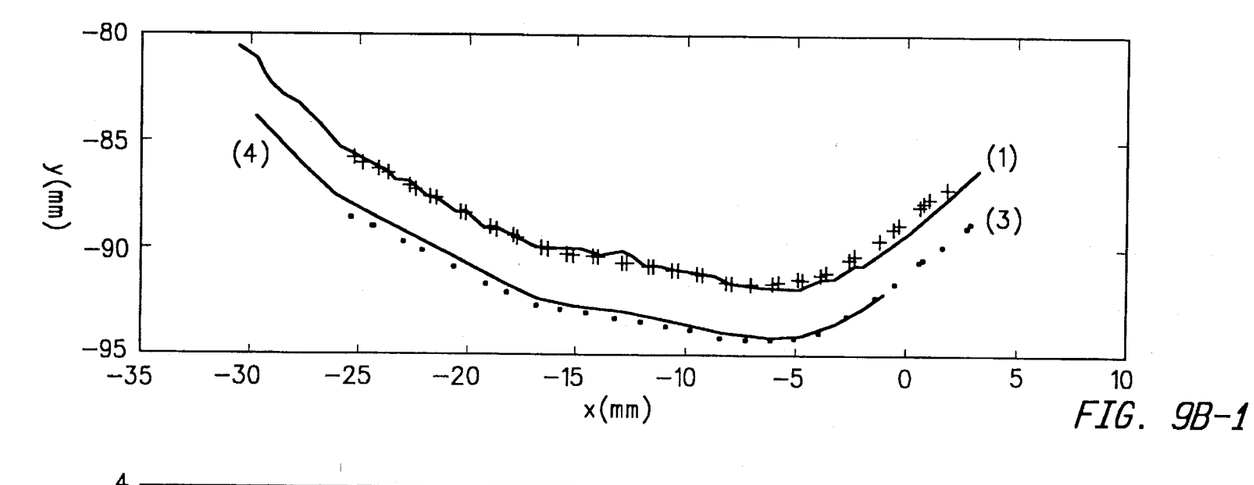
Figure 9B:
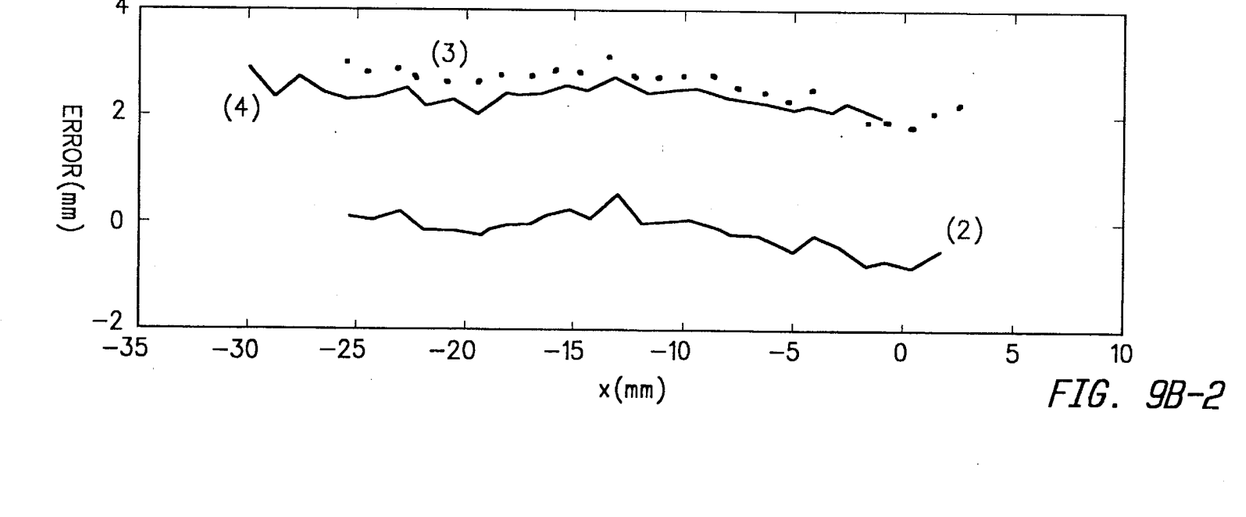

Two segments of the contour corresponding to the boundary between the brain and the skull (marked with arrows shown in FIG. 8), were picked manually from both CT and MR contour-images. The disparities between these skull-brain contours were then calculated for fully corrected, partially corrected and uncorrected MR data sets, FIGS. 9A and 9B show the results. The top plots show the actual boundaries while the bottom plots show the disparity between the CT and the MR contours. Table 2 below shows the mean ($\mu$), standard deviation ($\sigma$) and the range ($\rho$) of the disparities. Note that without any correction, the locations of the targets localized using MR differed from those localized using CT by a worst case error of 3.69 mm. With partial MR correction, the worst case error was 3.67 mm and with full correction the worst case error was 1.11 mm.

One might be concerned with the fact that the $\Delta\phi_s$-map typically has lower SNR (a factor of 4.9 in our case) than the $\Delta\phi_f$-map. This is because the phase values are smaller in $\Delta\phi_s$-map than in $\Delta\phi_f$-map while noise remains the same. However, in order to estimate the $\Delta\phi_s$-values inside each fiducial rod and deep inside the brain, we average the $\Delta\phi_s$-values in a collection of pixels (about 25 pixels in our case), leading to better SNR (about the same as that in the $\Delta\phi_f$-map) in the final estimate. Moreover, the only purpose of the $\Delta\phi_s$-map is to differentiate between integer multiples of $2\pi$, hence a crude estimate of $\Delta\phi$ is adequate.

TABLE 2

| | MIR Distortion Correction for Stereotaxy | | | | | |
|---|---|---|---|---|---|---|
| | Contour Segment (a) | | | Contour Segment (b) | | |
| | None | Partial | Full | None | Partial | Full |
| $\mu$ | 3.25 | 3.09 | 0.66 | 2.33 | 2.51 | −0.12 |
| $\sigma$ | 0.36 | 0.37 | 0.34 | 0.19 | 0.35 | 0.32 |
| $\rho$ | (2.68, 3.69) | (2.44, 3.67) | (0.12, 1.11) | (1.94, 2.81) | (1.77, 3.08) | (−0.77, 0.51) |

In both the cadaver experiment and the patient experiment the target localization techniques were completely automated (edge detection and 2D gaussian fitting) and did not require manual outlining of the structures. This eliminated errors induced by operator variability and enabled us to analyze the errors induced by the imaging apparatus more accurately.

The process of estimating the correct multiple of $2\pi$ involves minimal user interaction: identifying the connected components corresponding to the fiducial rods and a region deep inside the brain. Although this only takes about 20 seconds of user interaction, it is conceivable that using the geometric model of the fiducial system and a model based object recognition strategy, one could automate the above tasks.

When determining the transformation between the model of the fiducial system and the data, six parameter were estimated: three rotation and three translation parameters. We deliberately did not include the three scale factors. (We assumed geometric scaling to be accurately represented by the CT and MR devices.) Otherwise, because of varying degrees of geometric distortion present in uncorrected, partially corrected and fully corrected MR data sets, we would have obtained different scale factors for each data set. This would have produced erroneous estimates of geometric distortions since there should be only one set of scale factors for each modality.

In summary, stereotaxic target localization using MRI must be performed with care. The field inhomogeneity caused by the patient's head and the fiducial rods cause large misregistration errors. The correction technique presented here, which uses a volume $\Delta\phi$-map along with a single, larger-bandwidth, planar $\Delta\phi$-map, is shown to improve MR-guided stereotaxic target localization accuracy.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. In a method of correcting spatial distortion in magnetic resonance images due to magnetic field inhomogeneity in an object having disconnected regions, a method of correcting for phase-wraps in detected phase accural between the disconnected regions comprising the steps of
   (a) obtaining a first map of off-resonant nuclei spins $\Delta\phi_l$ during a first known time interval, $\Delta T_{E2}$, as a measure of perturbations, $\Delta B_o$ in a magnetic field, $B_o$ with $\Delta T_{E2}$ chosen so that the phase-difference between fat and water signals is a non-zero integer multiple of $2\pi$, and with phase-wraps between disconnected regions in said map of $\Delta\phi_l$,
   (b) obtaining a second map of off-resonant nuclei spins, $\Delta\phi_s$, encompassing all disconnected regions during a second known time interval, $\Delta T_{E1}$, as a measure of perturbations, $\Delta B_o$, in said magnetic field, $B_o$, with a $\Delta T_{E1}$ chosen to eliminate phase-wrap in said map of $\Delta\phi_s$,
   (c) subtracting from points in said first map a ratio, $\Delta T_{E2}/\Delta T_{E1}$, of corresponding points in said second map, and
   (d) dividing said phase difference by $2\pi$ to obtain a measure of phase-wrap at said points in said first map, and
   (e) subtracting from said first map said measure of phase-wrap.

2. The method as defined by claim 1 wherein said first map is three dimensional, said second map is two dimensional, and step c) selects points in a two dimensional slice from said three dimensional first map and a corresponding slice in said second map.

3. The method as defined by claim 2 wherein said object includes a human head inside of a stereotaxic fiducial frame having a plurality, n, of rods.

4. The method as defined by claim 3 wherein $S_i$ is magnitude image of said n rods in said second map, $L_i$ is magnitude image of said n rods in said first map, $s_i$ is average $\Delta\phi_s$ in $S_i$, $s_b$ is average $\Delta\phi_s$ in a brain region, $l_i$ is average $\Delta\phi_l$ in $L_i$, $l_b$ is average $\Delta\phi_l$ is said brain region, integers $\kappa_i$ and $\kappa_b$ are calculated as $$k_i = \text{ROUND}\left(\frac{1}{2\pi}\left[l_i - s_i\frac{\Delta T_{E2}}{\Delta T_{E1}}\right]\right), i = 1\ldots n,$$

$$k_b = \text{ROUND}\left(\frac{1}{2\pi}\left[l_b - s_b\frac{\Delta T_{E2}}{\Delta T_{E1}}\right]\right).$$

$$\kappa_i = \kappa_i - \kappa_b, i = 1\ldots n.$$

$V_i$=points within the rods i=. . . n), $\Delta\phi_l(p)$ is the $\Delta\phi_l$ value at image location p, and $\Delta\phi_L(p)$ is the corrected $\Delta\phi_l(p)$ value as follows:

$$\Delta\phi_L(p) = \begin{cases} \Delta\phi_1(p) - 2\pi\hat{\kappa}_i & \text{if } p \in V_i \\ \Delta\phi_1(p) & \text{otherwise} \end{cases}$$

5. The method as defined by claim 1 wherein step a) includes obtaining a first map of off-resonant nuclei spins with phase-unwrapping within each of said disconnected regions.

6. The method as defined by claim 1 wherein said measure of phase wraps is an integer obtained by dividing said phase difference by $2\pi$ and rounding off to the nearest integer.

* * * * *